United States Patent
Giduturi

(10) Patent No.: US 6,621,342 B2
(45) Date of Patent: Sep. 16, 2003

(54) DYNAMIC CASCODING TECHNIQUE FOR OPERATIONAL AMPLIFIERS

(75) Inventor: Hari Giduturi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/062,867

(22) Filed: Jan. 31, 2002

(65) Prior Publication Data

US 2002/0070804 A1 Jun. 13, 2002

Related U.S. Application Data

(63) Continuation of application No. 09/675,196, filed on Sep. 29, 2000.

(51) Int. Cl.⁷ .............................................. H03F 3/45
(52) U.S. Cl. ..................... 330/253; 330/258; 330/261
(58) Field of Search .............................. 330/252, 253, 330/258, 261

(56) References Cited

U.S. PATENT DOCUMENTS

| | | | | |
|---|---|---|---|---|
| 4,538,115 A | * | 8/1985 | Butler ........................ | 330/253 |
| 4,622,480 A | | 11/1986 | Uchimura | |
| 4,661,779 A | * | 4/1987 | Okamoto .................... | 330/253 |
| 5,065,111 A | * | 11/1991 | Tsukuda et al. ............ | 330/253 |
| 5,142,243 A | * | 8/1992 | Eddlemon ................... | 330/253 |
| 5,894,245 A | * | 4/1999 | Cho .......................... | 330/253 |

FOREIGN PATENT DOCUMENTS

JP          3-292007          12/1991

* cited by examiner

*Primary Examiner*—Henry Choe
(74) *Attorney, Agent, or Firm*—Peter Lam

(57) ABSTRACT

An apparatus for a differential amplifier with dynamic cascodes. The apparatus of one embodiment comprises a dynamic cascode bias generator. A first and second cascode transistors are coupled to the generator. A differential pair is coupled to the cascode transistors. The differential pair comprises of a first input transistor to receive an inverting input and a second input transistor to receive a non-inverting input.

19 Claims, 5 Drawing Sheets

DYNAMIC CASCODING TECHNIQUE FOR OPERATIONAL AMPLIFIERS

This patent application is a Continuation of U.S. patent application Ser. No. 09/675,196, entitled "Dynamic Cascoding Technique For Operational Amplifiers", filed Sep. 29, 2000.

FIELD OF THE INVENTION

The present invention relates generally to the field of analog and mixed signal processing integrated circuits and operational amplifiers. More particularly, the present invention relates to dynamic cascoding technique for operational amplifiers.

BACKGROUND OF THE INVENTION

Operational amplifiers (op amps) often include a widely used technique called cascoding in order to increase output impedance and to reduce the effect of Miller capacitance. By cascoding transistors in op amps powered with high voltages, such as those used in flash memory chips, the impact ionization current through the cascoded transistors can also be reduced. However, these advantages come at the expense of the common mode range of the op amp. Normal cascoding can reduce the common mode range.

The gates of the cascode transistors are driven from a fixed DC voltage in traditional cascoding techniques. This arrangement causes the cascode transistors to turn off as the common mode input voltage of the differential amplifier is about a threshold voltage from the gate voltage of the cascode transistors. As a result, the differential pair is also turned off. Thus, the upper end or the lower end of the common mode voltage range is reduced, depending on whether the input transistors of the differential pair are N type or P type transistors.

BRIEF DESCRIPTION OF THE DRAWINGS

The present invention is illustrated by way of example and not limitations in the figures of the accompanying drawings, in which like references indicate similar elements, and in which.

DETAILED DESCRIPTION

A method and apparatus for a dynamic cascoding technique for operational amplifiers is disclosed. The embodiments described herein are described in the context of a memory, but are not so limited. Although the following embodiments are described with reference to flash memory and high voltage op amps, the embodiments are applicable to other integrated circuits or logic devices. The same techniques and teachings of the present invention can easily be applied to other types of circuits or semiconductor devices that use op amps.

In the following description, for purposes of explanation, numerous specific details are set forth in order to provide a thorough understanding of the present invention. One of ordinary skill in the art, however, will appreciate that these specific details are not necessary in order to practice the present invention. In other instances, well known electrical structures and circuits have not been set forth in particular detail in order to not necessarily obscure the present invention.

Cascode transistors are typically inserted in series with the cascoded transistors in the signal path. These transistors are coupled together in a common gate configuration with the gate driven from a fixed DC voltage. However, this traditional approach severely limits the output voltage range of a differential amplifier. As the common mode input voltage approaches the gate voltage of the cascode transistors, the cascode transistors are turned off, thus shutting off the whole differential amplifier.

Embodiments of the present invention offer a solution to this decreased common mode range problem. The gate voltage of the cascode transistors can be dynamically changed based on the value of the common mode input voltage to the differential amplifier. This dynamic cascoding technique can prevent the cascode transistors from turning off. Embodiments of the present invention can be applied to analog circuits built from N type and P type metal oxide semiconductor transistors without requiring any special components.

Dynamic cascode bias generator circuits can be used in high voltage analog amplifiers or buffers in the flash memory chips. Embodiments of a dynamic cascode bias generator circuit in accordance with the present invention can be used in a single rail to rail op amp circuit that can meet the requirements of all wordline, bitline, and source voltage buffers.

Figure 1:
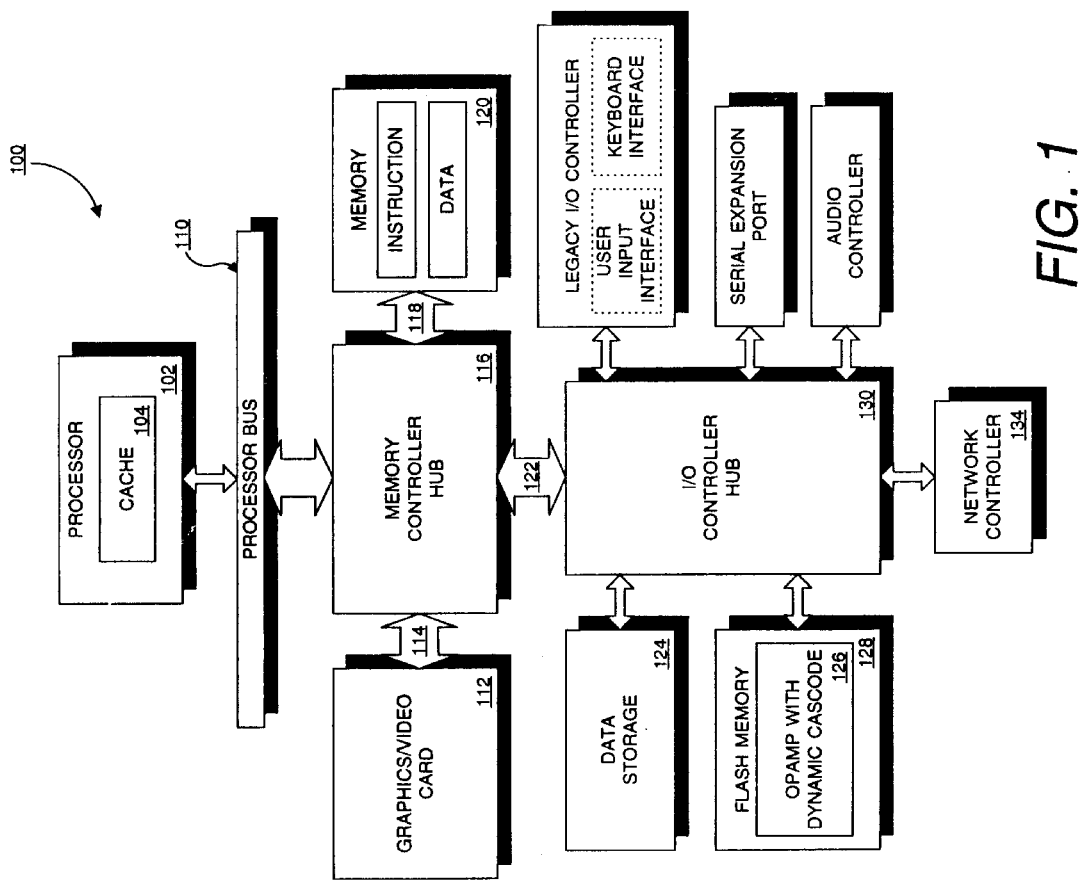
FIG. 1 is a block diagram of one embodiment of a computer system that includes a memory using a dynamic cascode differential amplifier.

Referring now to FIG. 1, a computer system 100 is shown. System 100 includes a component, such as a flash memory 128, employing an operational amplifier (op amp) with dynamic cascodes 126 in accordance with the present invention, such as in the embodiment described herein. System 100 is representative of processing systems based on the Intel PENTIUM® II, PENTIUM® III, Itanium® microprocessors available from Intel Corporation of Santa Clara, Calif., although other systems (including PCs having other microprocessors, engineering workstations, set-top boxes, handheld telephones and the like) may also be used. In one embodiment, sample system 100 may be executing a version of the WINDOWS™ operating system available from Microsoft Corporation of Redmond, Wash., although other operating systems and graphical user interfaces, for example, may also be used. Thus, the present invention is not limited to any specific combination of hardware circuitry and software.

FIG. 1 is a block diagram of one embodiment of a system 100. System 100 is an example of a hub architecture. The computer system 100 includes a processor 102 that processes data signals. The processor 102 may be a complex instruction set computer (CISC) microprocessor, a reduced instruction set computing (RISC) microprocessor, a very long instruction word (VLIW) microprocessor, a processor implementing a combination of instruction sets, or other processor device, such as a digital signal processor, for example. FIG. 1 shows an example of an embodiment of the present invention implemented in a single processor system 100. However, it is understood that other embodiments may alternatively be implemented as systems having multiple processors. Processor 102 is coupled to a processor bus 110 that transmits data signals between processor 102 and other components in the system 100. The elements of system 100 perform their conventional functions well known in the art.

System 100 includes a memory 120. Memory 120 may be a dynamic random access memory (DRAM) device, a static random access memory (SRAM) device, flash memory device, or other memory device. Memory 120 may store instructions and/or data represented by data signals that may be executed by processor 102. A cache memory 104 can reside inside processor 102 that stores data signals stored in memory 120. Alternatively, in another embodiment, the cache memory may reside external to the processor.

A system logic chip 116 is coupled to the processor bus 110 and memory 120. The system logic chip 116 in the illustrated embodiment is a memory controller hub (MCH). The processor 102 communicates to the MCH 116 via a processor bus 110. The MCH 116 provides a high bandwidth memory path 118 to memory 120 for instruction and data storage and for storage of graphics commands, data and textures. The MCH 116 directs data signals between processor 102, memory 120, and other components in the system 100 and bridges the data signals between processor bus 110, memory 120, and system I/O 122. In some embodiments, the system logic chip 116 provides a graphics port for coupling to a graphics controller 112. The MCH 116 is coupled to memory 120 through a memory interface 118. The graphics card 112 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices. Some examples are the audio controller, firmware hub (BIOS), data storage 124, legacy I/O controller containing user input and keyboard interfaces, a serial expansion port such as Universal Serial Bus (USB), and a network controller 134. The data storage device 124 can comprise a hard disk drive, a floppy disk drive, a CD-ROM device, a flash memory device, or other mass storage device.

The firmware hub in this system employs a flash memory device 128. An op amp with dynamic cascodes 126 to also resides in flash memory 128. Alternate embodiments of an op amp 126 can also be used in microcontrollers, embedded processors, graphics devices, DSPs, and other types of logic circuits. Op amps can also be referred to as amplifiers or buffers.

The present enhancement is not limited to computer systems. Alternative embodiments of the present invention can be used in other devices such as, for example, handheld devices and embedded applications. Some examples of handheld devices include cellular phones, Internet Protocol devices, digital cameras, personal digital assistants (PDAs), and handheld PCs. Embedded applications can include a microcontroller, a digital signal processor (DSP), system on a chip, network computers (NetPC), set-top boxes, network hubs, wide area network (WAN) switches, or any other system which uses an op amp for other embodiments.

Figure 2:
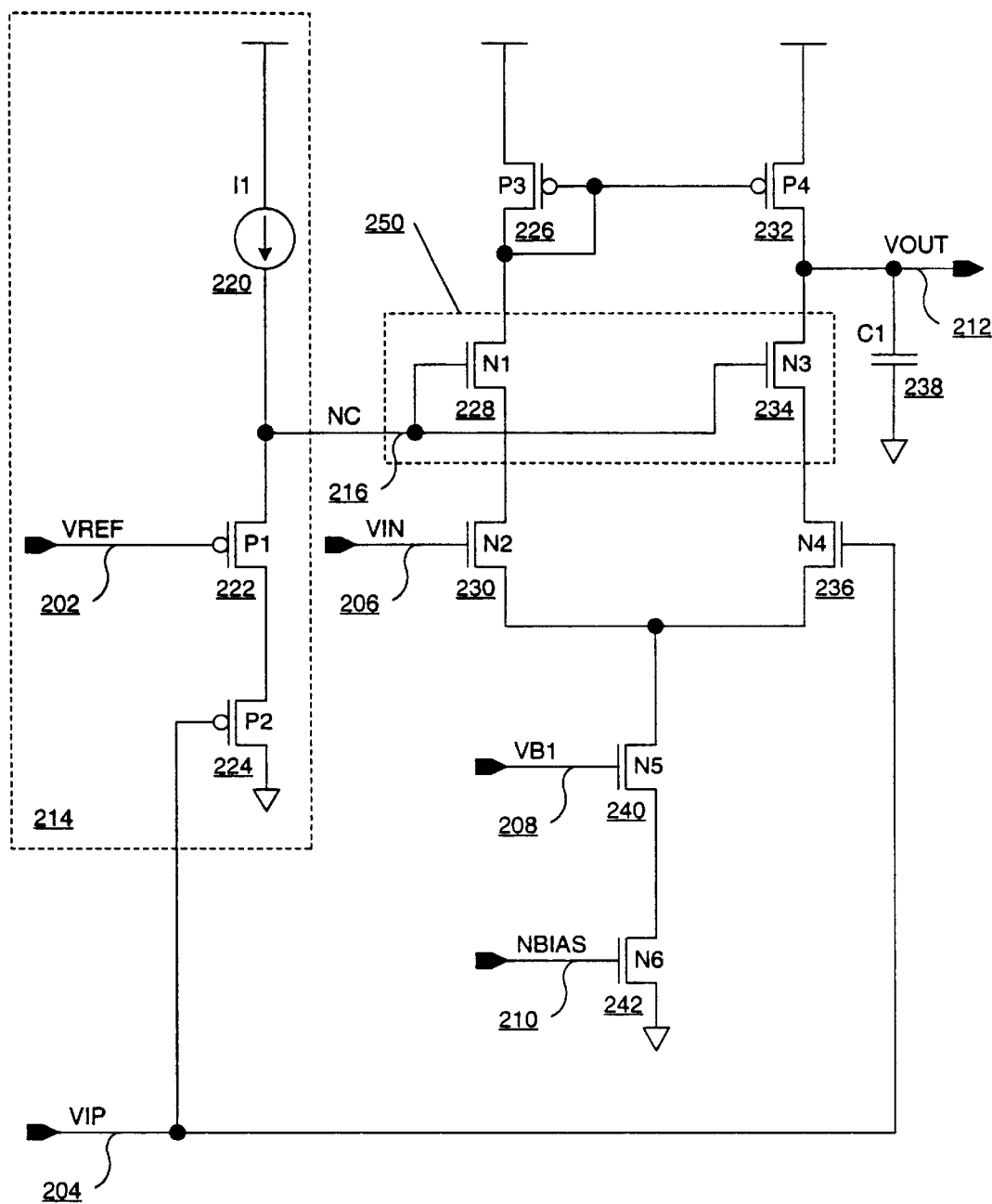
FIG. 2 is a circuit diagram of an NMOS dynamic cascode differential amplifier.

FIG. 2 is a circuit diagram of an NMOS (N type Metal Oxide Semiconductor) dynamic cascode differential amplifier. The basic differential amplifier structure comprises of a differential pair to receive inputs, loads coupled to the differential pair, and a bias current. The differential amplifier of this embodiment employs a dynamic cascode bias generator 214 and a pair of cascode transistors 250. Input signals VIN 206 and VIP 204 are the differential input to the differential amplifier.

P type field effect transistor P3 226 has its source terminal coupled to a supply voltage, its gate terminal coupled to its drain terminal and also to the gate terminal of P type transistor P4 232. The drain terminal of load device P3 226 is also coupled to the drain terminal of N type field effect transistor N1 228. The gate terminal of N1 228 is coupled to the dynamic cascode bias generator 214 at node NC 216. The source terminal of cascode device N1 228 is coupled to the drain terminal of N type transistor N2 230. The gate terminal of N2 230 receives input signal VIN 206.

P type transistor P4 232 has its source terminal coupled to a supply voltage and its gate terminal coupled to the gate terminal of P3 226. The drain terminal of load P4 232 is coupled to the drain terminal of N type transistor N3 234 and to a first terminal of load capacitor C1 238. The circuit configuration represented by P3 226 and P4 232 form the loads for the differential pair. However, these loads can be implemented in several different ways. The use of dynamic cascading technique is not limited to the particular implementation shown in FIG. 2. The second terminal of C1 238 is coupled to a ground potential. In general, the load C1 238 can also be a combination of resistive load and a capacitive load. The node at the drain terminal of P4 232 also provides the output of the differential amplifier as VOUT 212. The gate terminal of N3 234 is coupled to the dynamic cascode bias generator 214 at node 216. The source terminal of cascode transistor N3 234 is coupled to the drain terminal of N type transistor N4 236. The gate terminal of N4 236 is coupled to input signal VIP 204.

The source terminals of N2 230 and N4 236 are coupled together with the drain terminal of N type transistor N5 240. N5 240 is an optional device to improve the quality of the tail current through the current source N6 242. The gate terminal of N5 240 is coupled to control signal VB1 208. The source terminal of N5 240 is coupled to the drain terminal of N type transistor N6 242. Device N6 242 behaves as the current source for the tail current of the differential pair. The current source can also be implemented as a simple resistor. Input signal NBIAS 210 to bias the current is coupled to the gate terminal of N6 242. The source terminal of N6 242 is coupled to a ground potential.

The dynamic cascode bias generator 214 comprises of a current source I1 220 coupled to a supply voltage at its first terminal. The second terminal of I1 220 is coupled to the gate terminals of N1 228 and N3 234. The second terminal of I1 220 is also coupled to the source terminal of P type transistor P1 222. Input signal VREF 202 is a reference voltage coupled to the gate terminal of P1 222. VREF 202 is set to a value above half of power supply voltage. This reference sets the voltage at which the dynamic cascode circuit output voltage NC starts increasing towards the power supply voltage value as the common mode input voltage increases. The drain terminal of P1 222 is coupled to the source terminal of P type transistor P2 224. The gate terminal of P2 224 is coupled to input signal VIP 204 and the drain terminal of P2 224 is coupled to a ground potential. In the simplest case, the current source I1 220 can be a resistor.

For the NMOS differential pair of FIG. 2, N type cascode transistors 250 have been inserted between drain terminals of input transistors N2 230, N4 236, and the load transistors P3 226, P4 232. The dynamic cascode bias generator circuit 214 provides a voltage to the gate terminals of the cascode transistors 250 at node NC. This voltage varies based on the value of the common mode input voltage.

For input voltages on VIP 204 and VIP 206 in the range from 0 volts to a value above half the power supply voltage, the dynamic cascode bias circuit 214 generates a fixed output voltage. The cascode transistors 250 operate in saturation. As the input voltages increase closer to the top of the power supply voltage rail, the output voltage of the dynamic cascode bias generator 214 increases and eventually becomes equal to the power supply voltage. During this phase, the increased gate voltage on the cascode transistors 250 causes N1 228 and N3 234 to move from saturation region into linear region. When the input voltage is close to the top of the power supply rail, the cascode transistors 250 operate as simple pass transistors. The cascode transistors 250 do not shut off. As a result, the common mode range of the amplifier increases.

Figure 3:
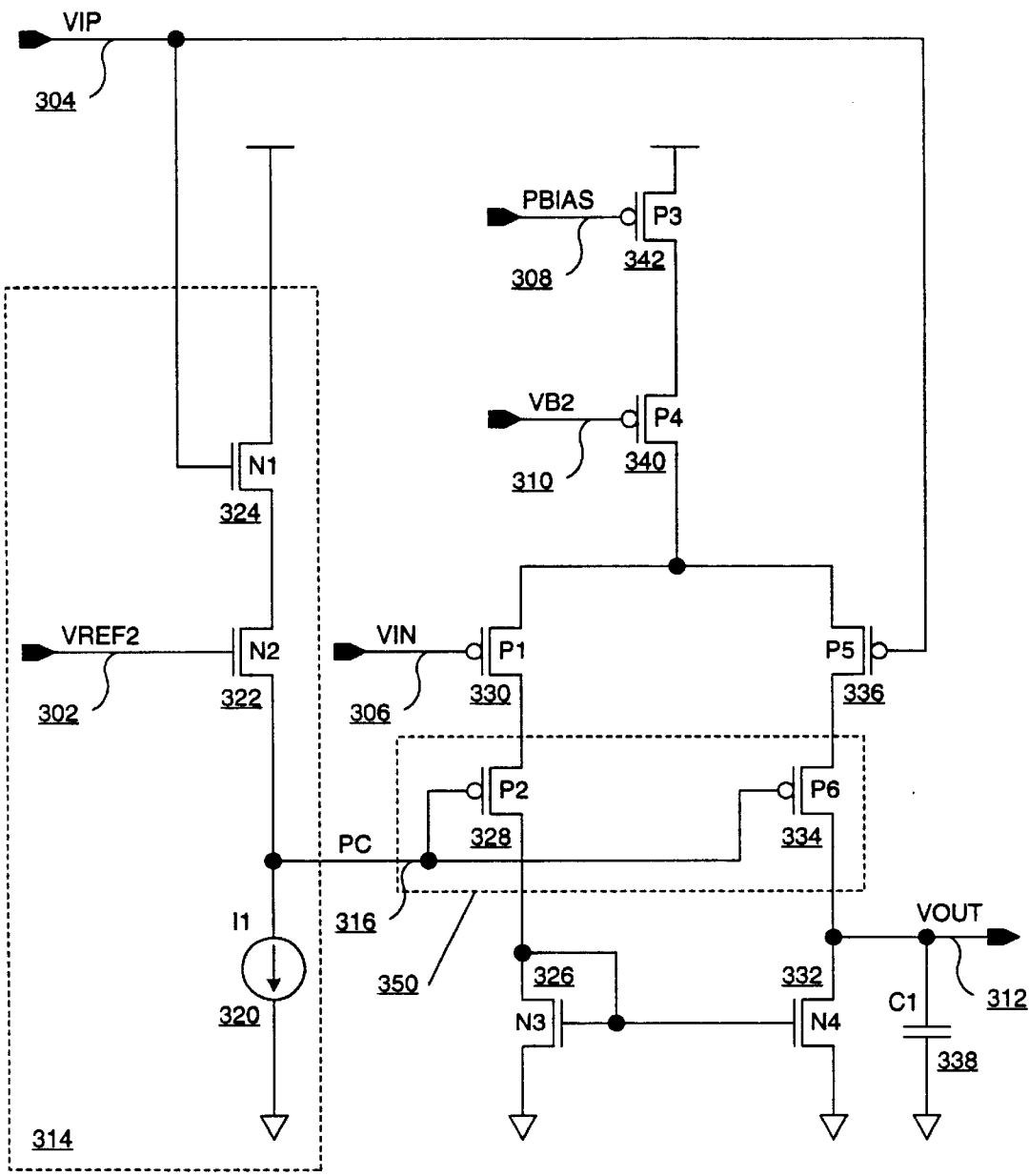
FIG. 3 is a circuit diagram of a PMOS dynamic cascode differential amplifier.

The dynamic cascode technique of the present invention can be used with both NMOS and PMOS differential amplifiers. The dynamic cascoding technique of the PMOS differential pair in FIG. 3 is similar to that of the NMOS differential pair in FIG. 2. However, the PMOS differential pair employs a dynamic cascode circuit complementary to that of the NMOS differential pair.

FIG. 3 is a circuit diagram of a PMOS (P type Metal Oxide Semiconductor) dynamic cascode differential amplifier. The basic differential amplifier structure comprises of a differential pair to receive inputs, loads coupled to the differential pair, and a bias current. The differential amplifier of this embodiment employs a dynamic cascode bias generator 314 and a pair of cascode transistors 350. Input signals VIN 306 and VIP 304 are the differential input to the differential amplifier.

The source terminal of P type transistor P3 342 is coupled to a supply voltage. Device P3 342 behaves as the current source for the tail current of the differential pair. Input signal PBIAS 308 to bias the current is coupled to the gate terminal of P3 342. The drain terminal of P3 342 is coupled to the source terminal of P type transistor P4 340. The gate terminal of P4 340 is coupled to control signal VB2 310. P4 340 is an optional device to improve the quality of the tail current through the current source. The drain terminal of P4 340 is coupled with the source terminal of P type transistor P1 330 and the source terminal of P type transistor P5 336.

The gate terminal of P1 330 receives input signal VIN 306. The drain terminal of P1 330 is coupled to the source terminal of P type transistor P2 328. The gate terminal of cascode device P2 328 is coupled to the dynamic cascode bias generator 314 at node PC 316. The drain terminal of P2 328 is coupled to the drain and gate terminals of N type field effect transistor N3 326, and also the gate terminal of N type transistor N4 332. The source terminal of load device N3 326 is coupled to a ground potential.

The gate terminal of P5 336 is coupled to input signal VIP 304. The drain terminal of P5 336 is coupled to the source terminal of P type transistor P6 334. The gate terminal of cascode transistor P6 334 is coupled to the dynamic cascode bias generator 314 at node 316. The drain terminal of P6 334 is coupled to the drain terminal of N type transistor N4 332 and to a first terminal of load capacitor C1 338. The second terminal of C1 338 is coupled to a ground potential. The node at the drain terminal of P6 334 also provides the output of the differential amplifier as VOUT 312. Load transistor N4 332 has its source terminal coupled to a ground potential and its gate terminal coupled to the gate terminal of P3 326.

The drain terminal of N type transistor N1 324 is coupled to a supply voltage and the gate terminal of N1 324 is coupled to input signal VIP 304. The source terminal of N1 324 is coupled to the drain terminal of N type transistor N2 322. Input signal VREF2 302 is a reference voltage coupled to the gate terminal of N2 322. VREF2 302 is set to a value below half the power supply voltage value. This reference sets the voltage at which the dynamic cascode circuit output voltage PC starts decreasing towards the lower end of the power supply rail as the common mode input voltage decreases. The dynamic cascode bias generator 314 also comprises of a current source I1 320 sinking current at its first terminal. The second terminal of I1 320 is coupled to a ground potential. The source terminal of N2 322 is coupled to the first terminal of I1 320. The gate terminals of P2 328 and P6 334 are also coupled to the first terminal of I1 320 at node 316.

The dynamic cascode bias generator circuit 314 provides a voltage to the gate terminals of the cascode transistors 350 at node PC. This voltage varies based on the value of the common mode input voltage. P type cascode transistors 350 are located between drain terminals of input transistors P1 330, P5 336, and the load transistors N3 326, N4 332. For input voltages on VIP 304 and VIP 306 in the range from the top of the power supply voltage rail to a value below half the power supply voltage, the dynamic cascode bias circuit 314 generates a fixed output voltage. The cascode transistors 350 operate in saturation.

As the input voltages decrease closer to the bottom of the power supply voltage rail, the output voltage of the dynamic cascode bias generator 314 decreases and eventually becomes equal to ground potential. During this phase, the decreased gate voltage on the cascode transistors 350 causes P2 328 and P6 334 to move from saturation region into linear region. When the input voltage is close to the top of the power supply rail, the cascode transistors 350 operate as simple pass transistors. The cascode transistors 350 do not shut off. As a result, the common mode range of the amplifier increases.

Rail to rail input/output voltage op amps are widely used in low voltage applications. Existing rail to rail input/output op amps are mainly used in low voltage applications. These op amps do not use any cascoding in the input stage as it limits the range of input and output common mode voltages. A similar type of circuit can be useful in high voltage applications. A circuit capable of both sourcing and sinking large currents can be used to satisfy the needs of all analog buffers in the high voltage section of flash memory chip. However, the analog buffers in the high voltage section of flash memory chips encounter large power supplies on the order of 11 volts or greater. Cascoding techniques have to be used in order to suppress the impact ionization current. The downside of traditional cascoding techniques is the reduced range of common mode voltage. Embodiments of a rail to rail op amp using a dynamic cascoding technique in accordance with the present invention in both the NMOS and PMOS differential pairs of the op amp can solve the reduced common mode range issue.

A single rail to rail op amp capable of sourcing and sinking large currents incorporates dynamic cascoding techniques in accordance with the present invention. Embodiments of this single circuit can satisfy the requirements of high voltage analog buffers in flash memory chips. The need for just one circuit instead of designing several with different voltage ranges can also reduce design times.

Figure 4:
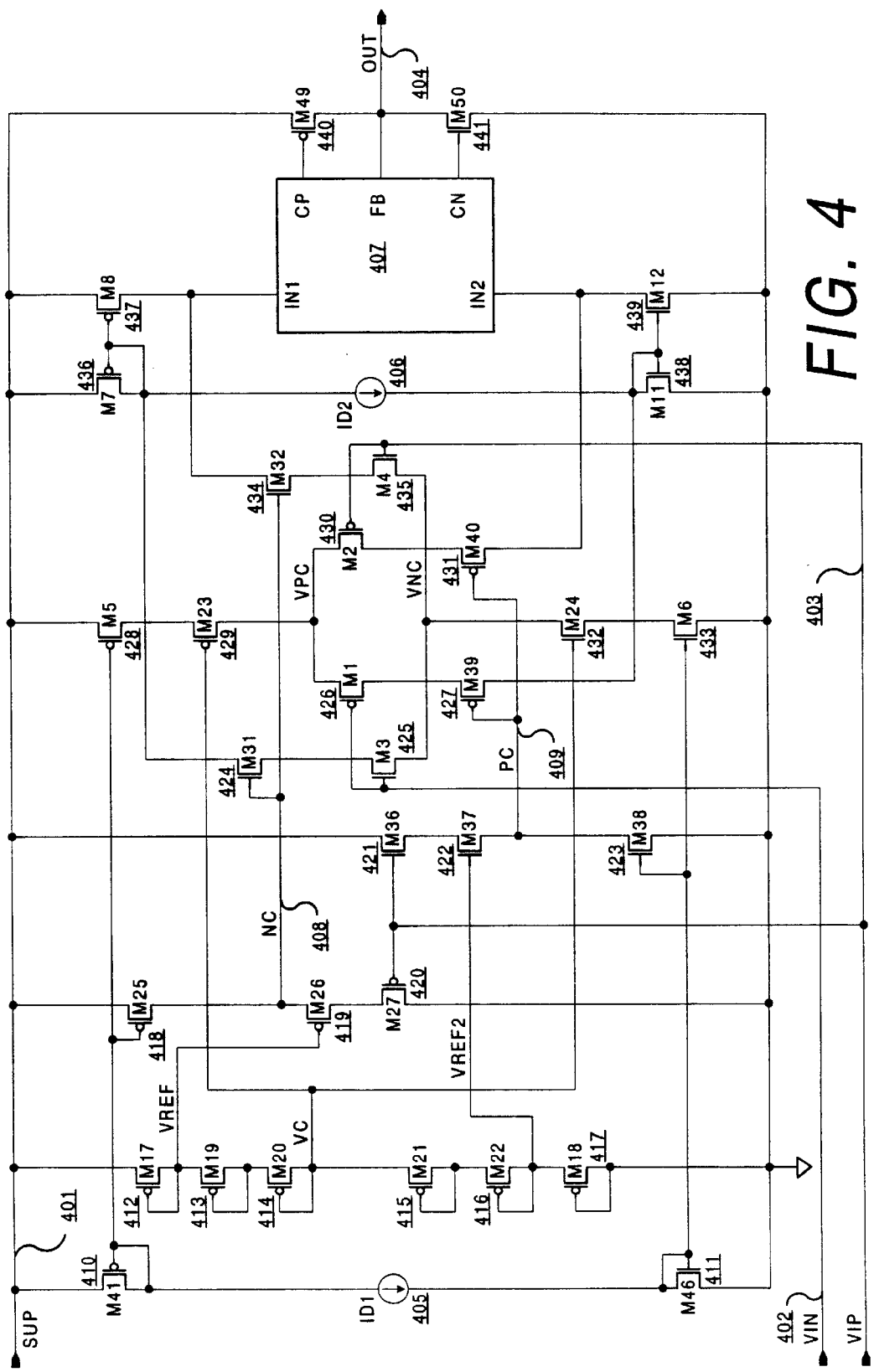
FIG. 4 is a circuit diagram of a rail to rail input/output operational amplifier with dynamic cascodes.

FIG. 4 is a circuit diagram of a rail to rail input/output operational amplifier (op amp) with dynamic cascodes. The op amp of this embodiment receives three input signals: SUP 401, VIN 402, and VIP 403. SUP 401 is a supply voltage that powers the circuit and can vary from 5 volts to 12 volts. Other ranges are possible in alternative embodiments. Input signals VIN 402 and VIP 403 are respectively the inverting and non-inverting differential inputs to the dynamic cascode differential amplifiers. The output of the op amp is available at output signal OUT 404.

For this embodiment, the M31 424 and M32 434 are the N type cascode transistors for the NMOS differential pair and M39 427 and M40 431 are the P type cascode transistors for the PMOS differential pair. The NMOS cascode transistors M31 424, M32 434, are driven by the dynamic cascode bias voltage NC 408. The PMOS cascode transistors M39 427, M40 431, are driven by the dynamic cascode bias voltage PC 409.

The op amp of this example comprises of three main sections. The first section comprises a floating current mirror with P type device M41 410, current source ID1 405, and N type device M46 411. The source terminal of M41 410 is coupled to SUP 401. M41 410 is diode connected as its gate and drain terminals are coupled together. A first terminal of ID1 405 is coupled to the drain terminal of M41 410. The gate and drain terminals of M46 411 are diode connected together with a second terminal of ID1 405. The source terminal of M46 411 is coupled to a ground potential. The transistors M41 410 and M46 411 represent P type and N type current mirrors.

A voltage divider is located adjacent to the current mirror in this embodiment. The voltage divider comprises of P type transistors M17 412, M19 413, M20 414, M21 415, M22 416, and M18 417. For this embodiment, all of the transistors in the voltage divider are sized identically such that the voltage potential of node VC at midpoint of the voltage divider is halfway between the power supply voltage SUP 401 and the ground potential. The source terminal of M17 412 at the top of the voltage divider is coupled to SUP 401 and the source terminal of M18 417 at the bottom of the divider is coupled to a ground potential. The gate and drain terminals of M17 412 are coupled to the source terminal of M19 413. The gate and drain terminals of M19 413 are in turn coupled to the source terminal of M20 414. Similarly, the gate and drain terminals of M20 414 are coupled to the source terminal of M21 415. The gate and drain terminals of M21 415 are coupled to the source terminal of M22 416. The gate and drain terminals of M17 412 are coupled to the source terminal of M18 417.

Reference voltages VREF and VREF2 to the cascode generators are generated from the voltage divider. For this embodiment, the reference voltage VREF for the NMOS differential amplifier is tapped between M17 412 and M19 413. VREF is set to a value above half of power supply voltage. Similarly, the reference voltage VREF2 for the PMOS differential amplifier is tapped between M22 416 and M18 417. VREF2 is set to a value below half the power supply voltage value. The voltages VREF and VREF2 can also be generated in alternative ways.

The first section also includes dynamic cascode bias generators for the later NMOS and PMOS differential amplifiers. The NMOS dynamic cascode bias generator comprises of P type transistors M25 418, M26 419, and M27 420. M25 418, M26 419, and M27 420 generate the voltage for NC. The source terminal of M25 418 is coupled to SUP 401 and the gate terminal is coupled to the gate terminal of M41 410. The drain terminal of M25 418 is coupled to source terminal of M26 419 at node NC. M25 418 behaves as part of a current source mirroring the current through ID1 405. The current mirror allows a small amount of current to flow for the operation of the dynamic cascode bias generator. The voltage potential at NC 408 controls NMOS differential amplifier cascode devices M31 424, M32 434. VREF is coupled to the gate terminal of M26 419. The drain terminal of M26 419 is coupled to the source terminal of M27 420. M27 420 is controlled with the VIP 403 input signal coupled to its gate terminal. The drain terminal of M27 420 is coupled to a ground potential.

As the input common mode voltage, VIP 403 in this case, increases towards the power supply voltage SUP 401, M27 420 slowly turns off, causing the voltage at NC 408 to rise to the power supply rail. The increased voltage potential on NC 408 causes M31 424 and M32 434 to move from saturation region into linear region, thus allowing the NMOS differential pair to operate without shutting off.

The PMOS dynamic cascode bias generator comprises of N type transistors M36 421, M37 422, and M38 423. The drain terminal of M36 421 is coupled to SUP 401 and the gate terminal is coupled to input signal VIP 403. The source terminal of M36 421 is to coupled to drain terminal of M37 422. VREF2 is coupled to the gate terminal of M37 422. The source terminal of M37 422 is coupled to drain terminal of M38 423 at node PC 409. Voltage PC 409 is the PMOS dynamic cascode bias voltage. The voltage potential at PC 409 controls PMOS differential amplifier cascode devices M39 427, M40 431. The gate terminal of M38 423 is coupled to the gate terminal of M46 411. M38 423 behaves as a current source mirroring the current through ID1 405. The source terminal of M38 423 is coupled to a ground potential.

The operation of the PMOS bias generator is similar to that of the NMOS bias generator described above. As the input common mode voltage VIP 403 decreases towards the lower supply rail, M36 421 slowly turns off, causing the voltage at PC 409 to drop to a ground potential. The decreased voltage potential on PC 409 causes M39 427 and M40 431 to move from saturation region into linear region, thus allowing the PMOS differential pair to operate without shutting off.

The second section of the op amp comprises of back to back coupled PMOS and NMOS differential amplifiers. The NMOS differential amplifier comprises of M7 436, M8 437, M31 424, M32 434, M3 425, M4 435, M24 432, and M6 433. These devices are configured similar to those of the NMOS dynamic cascode differential amplifier of FIG. 2. The source terminals of P type load devices M7 436 and M8 437 are coupled to SUP 401. The gate terminals of M7 436 and M8 437 are coupled together with the drain terminal of M7 436 and the drain terminal of cascode device M31 424. The drain terminal of M8 437 is coupled to the drain terminal of cascode device M32 434. Gate terminals of M31 424 and M32 434 are coupled to the NMOS dynamic cascode bias voltage NC 408. The source terminals of M31 424 and M32 434 are coupled to the drain terminals of differential pair M3 425 and M4 435, respectively. Inverting input VIN 402 and non-inverting input VIP 403 are coupled to the differential pair at M3 425 and M4 435, respectively. The source terminals of M3 425 and M4 435 are coupled together with the drain terminal of M24 432 at VNC. The gate terminal of optional cascode transistor M24 432 is coupled to VC. The source terminal of M24 432 is coupled to the drain terminal of M6 433. The gate terminal of M6 433 is coupled to the gate terminal of M46 411 and the source terminal is coupled to ground potential.

The PMOS differential amplifier comprises of M11 438, M12 439, M39 427, M40 431, M1 426, M2 430, M23 429, and M5 428. These devices are configured similar to those of the PMOS dynamic cascode differential amplifier of FIG.

3. The source terminals of N type load devices M11 438 and M12 439 are coupled to a ground potential. The gate terminals of M11 438 and M12 439 are coupled together with the drain terminal of M11 438 and the drain terminal of cascode device M39 427. The drain terminal of M12 439 is coupled to the drain terminal of cascode device M40 431. Gate terminals of M39 427 and M40 431 are coupled to the PMOS dynamic cascode bias voltage PC 409. The source terminals of M39 427 and M40 431 are coupled to the drain terminals of differential pair M1 426 and M2 439, respectively. Inverting input VIN 402 and non-inverting input VIP 403 are coupled to the differential pair at M1 426 and M2 430, respectively. The source terminals of M1 426 and M2 439 are coupled together with the drain terminal of M23 429 at VPC. The gate terminal of optional cascode transistor M23 429 is coupled to VC. The source terminal of M23 429 is coupled to the drain terminal of M5 428. The gate terminal of M5 428 is coupled to the gate terminal of M41 410 and the source terminal is coupled to SUP 401.

At the back end of the op amp is an output stage. The output stage includes a push-pull control and compensation circuit 407. The output of the NMOS differential amplifier at the drain terminals of M32 434 and M8 437 are coupled to a first input IN1 of the control and compensation circuit 407. The output of the PMOS differential amplifier at the drain terminals of M40 431 and M12 439 are coupled to a second input IN2 of the control and compensation circuit 407. The control and compensation circuit 407 drives the gate terminals of output transistors M49 440 and M50 441. P type output transistor M49 440 has its source terminal coupled to supply voltage SUP 401 and its drain terminal coupled to op amp output node OUT 404. N type output transistor M50 441 has its source terminal coupled to a ground potential and its drain terminal coupled to op amp output node OUT 404. OUT 404 is also fed back into the control and compensation circuit 407 at input FB in order to stabilize the circuit.

The transconductance (gm) of the NMOS input stage should match that of the PMOS input stage so that the gain of the amplifier is fairly constant over the entire common mode range. For alternate embodiments, other types of biasing schemes can be used to bias the NMOS differential and PMOS differential pair current sources. Similarly, an elaborate biasing scheme can be used to obtain constant gain when one of the differential pair slowly turns-off while the other provides the overall gain.

Figure 5:
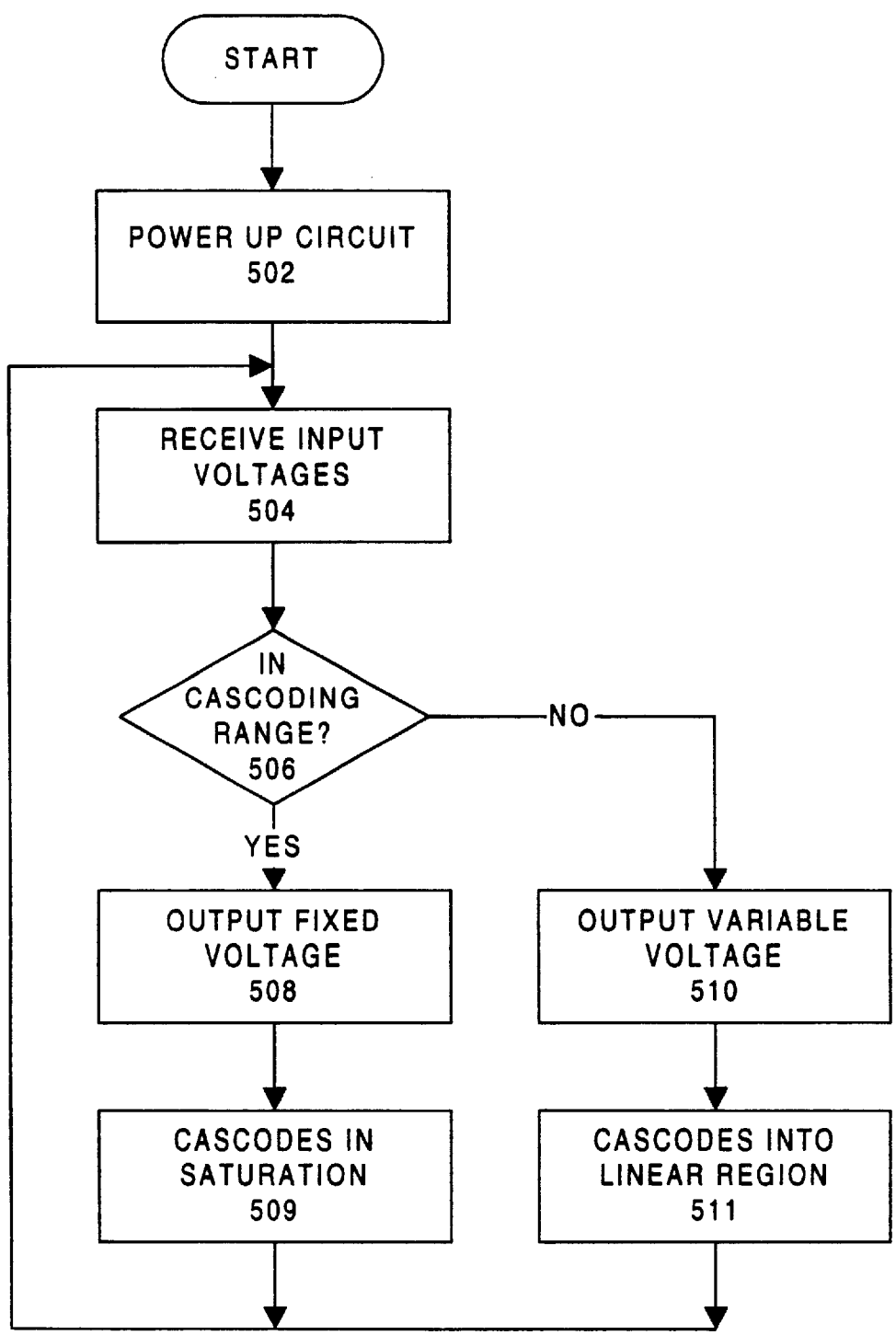
FIG. 5 is a flow diagram for one embodiment of a method of the present invention.

FIG. 5 is a flow diagram for one embodiment of a method of the present invention. At step 502, a supply voltage is received and the circuit is enabled. For this embodiment, the circuit is enabled at 5 volts. The common mode input voltages are received at step 504. A determination is made as to whether the input voltage is within the cascoding range or outside the cascoding range at step 506. For this example, the cascading range refers to the input range wherein the cascode transistors will remain in saturation. Outside if the region, the cascoding transistors will move out of the saturation region and into linear region. For the NMOS differential amplifier, the dynamic cascoding will be enable when the input approaches the supply rail. For the PMOS differential amplifier, dynamic cascoding will become effective when the input is decreasing towards ground potential. If the input voltage within the cascoding range, then the fixed voltage is generated at step 508. During this phase, the cascodes operated in a saturation mode at step 509. If the common mode input voltage is outside the cascoding range, dynamic cascoding is enabled and a variable voltage is generated at step 510.

For the NMOS differential amplifier, as the input voltages increase closer to the top of the power supply voltage rail, the output voltage to the cascodes also increases and eventually becomes equal to the power supply voltage. During this phase, the increased voltage causes the cascodes to move into the linear region at step 511. For the PMOS differential amplifier, as the input voltages decrease towards the lower voltage rail or ground potential, the output voltage to the cascodes also decreases and eventually becomes equal to ground potential. During this phase, the decreased voltage causes the P type cascodes to move into the linear region at step 511. The input voltages continue to be received at the circuit at step 504 and the generated voltage adjusted accordingly.

In the foregoing specification, the invention has been described with reference to specific exemplary embodiments thereof. It will, however, be evident that various modifications and changes may be made thereof without departing from the broader spirit and scope of the invention as set forth in the appended claims. The specification and drawings are, accordingly, to be regarded in an illustrative rather than a restrictive sense.

What is claimed is:

1. An integrated circuit device comprising:
   a high voltage power supply; and
   a rail to rail input/output operational amplifier comprising:
      a dynamic cascode bias generator to provide a first bias voltage to control a first set of cascode transistors and a second bias voltage to control cascode transistors, said first bias voltage to increase towards a power supply voltage in response to a first common mode input voltage increasing above a first reference value and said second bias voltage to decrease towards a ground potential in response to a second common mode input voltage decreasing below a second reference value;
      an N type differential amplifier coupled to said dynamic cascode bias generator, said N type differential amplifier to have said first common mode input voltage across its inputs; and
      a P type differential amplifier coupled to said dynamic cascode bias generator, said P type differential amplifier to have said second common mode input voltage across its inputs.

2. The integrated circuit device of claim 1 wherein said N type differential amplifier comprises:
   a first and second N type cascode transistors coupled to said dynamic cascode bias generator; and
   an N type differential pair coupled to said first and second N type cascode transistors, said N type differential pair comprising of a first N type input transistor to receive an inverting input and a second N type input transistor to receive a non-inverting input.

3. The integrated circuit device of claim 1 wherein said P type differential amplifier comprises:
   a first and second P type cascode transistors coupled to said dynamic cascode bias generator; and
   a P type differential pair coupled to said first and second P type cascode transistors, said P type differential pair comprising of a first P type input transistor to receive said inverting input and a second P type input transistor to receive said non-inverting input.

4. The integrated circuit device of claim 2 wherein said dynamic cascode bias generator generates a first bias voltage to said first and second N type cascode transistors.

5. The integrated circuit device of claim 4 wherein said bias voltage has a fixed value in a first mode and said bias voltage increases towards upper range of a power supply voltage rail in a second mode.

6. The integrated circuit device of claim 3 wherein said dynamic cascode bias generator generates a first bias voltage to said first and second P type cascode transistors.

7. The integrated circuit device of claim 6 wherein said bias voltage has a fixed value in a first mode and said bias voltage decreases towards lower range of a power supply voltage rail in a second mode.

8. An operational amplifier comprising:
    a dynamic cascode bias generator to generate a bias voltage having a fixed value in a first mode and increasing towards upper range of a power supply voltage rail in a second mode; and
    an N type differential amplifier coupled to said dynamic cascode bias generator, said N type differential amplifier comprising:
        a first and second N type cascode transistors coupled to receive said bias voltage from said dynamic cascode bias generator; and
        an N type differential pair coupled to said first and second N type cascode transistors, said N type differential pair comprising of a first N type input transistor to receive an inverting input and a second N type input transistor to receive a non-inverting input.

9. The operational amplifier of claim 8 further comprising a common mode input signal coupled to said first N type input transistor and to said second N type input transistor, said common mode input signal to vary from a first voltage level to a second voltage level.

10. The operational amplifier of claim 9 wherein said first voltage level is below a midpoint between an upper power supply rail and a lower power supply rail.

11. The operational amplifier of claim 10 wherein said second voltage level is above said midpoint between said upper and said lower power supply rails.

12. The operational amplifier of claim 11 wherein said dynamic cascode bias generator generates variable voltages when said common mode input signal is outside a cascoding range.

13. The operational amplifier of claim 12 wherein said cascoding range ranges from said midpoint between said upper and said lower power supply rails to said lower power supply rail.

14. An operational amplifier comprising:
    a dynamic cascode bias generator to generate a bias voltage having a fixed value in a first mode and decreasing towards lower range of a power supply voltage rail in a second mode; and
    a P type differential amplifier coupled to said dynamic cascode bias generator, said P type differential amplifier comprising:
        a first and second P type cascode transistors coupled to receive said bias voltage from said dynamic cascode bias generator; and
        an P type differential pair coupled to said first and second P type cascode transistors, said P type differential pair comprising of a first P type input transistor to receive an inverting input and a second P type input transistor to receive a non-inverting input.

15. The operational amplifier of claim 14 further comprising a common mode input signal coupled to said first P type input transistor and to said second P type input transistor, said common mode input signal to vary from a first voltage level to a second voltage level.

16. The operational amplifier of claim 15 wherein said first voltage level is above said midpoint between said upper and said lower power supply rails.

17. The operational amplifier of claim 16 wherein said second voltage level is below a midpoint between an upper power supply rail and a lower power supply rail.

18. The operational amplifier of claim 17 wherein said dynamic cascode bias generator generates variable voltages when said common mode input signal is outside a cascoding range.

19. The operational amplifier of claim 18 wherein said cascoding range ranges from said midpoint between said upper and said lower power supply rails to said upper power supply rail.

* * * * *

UNITED STATES PATENT AND TRADEMARK OFFICE
CERTIFICATE OF CORRECTION

PATENT NO. : 6,621,342 B2
DATED : September 16, 2003
INVENTOR(S) : Giduturi

It is certified that error appears in the above-identified patent and that said Letters Patent is hereby corrected as shown below:

Column 4,
Line 19, delete "cascading", insert -- cascoding --.

Column 8,
Line 18, before "coupled to", delete "to".

Column 9,
Line 52, delete "cascading", insert -- cascoding --.

Signed and Sealed this

Twenty-fifth Day of May, 2004

JON W. DUDAS
*Acting Director of the United States Patent and Trademark Office*